United States Patent
Kim et al.

(10) Patent No.: US 7,423,501 B2
(45) Date of Patent: Sep. 9, 2008

(54) FILM BULK ACOUSTIC WAVE RESONATOR AND MANUFACTURING METHOD THEREROF

(75) Inventors: Duck-hwan Kim, Goyang-si (KR); Chul-soo Kim, Hwaseong-si (KR); Yun-kwon Park, Dongducheon-si (KR); Sang-chul Sul, Suwon-si (KR); Byeoung-ju Ha, Seongnam-si (KR); In-sang Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 316 days.

(21) Appl. No.: 11/395,298

(22) Filed: Apr. 3, 2006

(65) Prior Publication Data

US 2007/0013463 A1    Jan. 18, 2007

(30) Foreign Application Priority Data

Jul. 18, 2005   (KR) .................. 10-2005-0064803

(51) Int. Cl.
*H03H 9/15* (2006.01)
*H03H 9/17* (2006.01)
*H03H 9/54* (2006.01)

(52) U.S. Cl. .............. 333/187; 310/360; 310/365
(58) Field of Classification Search ............... 333/187; 310/360
See application file for complete search history.

(56) References Cited

U.S. PATENT DOCUMENTS

| | | | | | |
|---|---|---|---|---|---|
| 3,401,275 | A | * | 9/1968 | Berlincourt et al. | 310/320 |
| 3,582,839 | A | * | 6/1971 | Pim et al. | 333/191 |
| 3,590,287 | A | * | 6/1971 | Berlincourt et al. | 310/321 |
| 4,636,678 | A | * | 1/1987 | Ballato | 310/313 R |
| 4,691,714 | A | * | 9/1987 | Wong et al. | 600/551 |
| 4,719,383 | A | * | 1/1988 | Wang et al. | 310/324 |
| 6,150,703 | A | * | 11/2000 | Cushman et al. | 257/415 |
| 7,148,604 | B2 | * | 12/2006 | Inoue et al. | 310/322 |
| 7,230,511 | B2 | * | 6/2007 | Onishi et al. | 333/187 |
| 2004/0007940 | A1 | * | 1/2004 | Tsai et al. | 310/313 R |

\* cited by examiner

*Primary Examiner*—Barbara Summons
(74) *Attorney, Agent, or Firm*—Sughrue Mion, PLLC

(57) ABSTRACT

A film bulk acoustic resonator includes a substrate; a lower electrode formed on top of the substrate; a piezoelectric membrane formed on top of the lower electrode and having a crystallographic axis so inclined as to generate a total reflection when an acoustic wave advances toward the lower electrode; and an upper electrode formed on top of the piezoelectric membrane.

7 Claims, 4 Drawing Sheets

FILM BULK ACOUSTIC WAVE RESONATOR AND MANUFACTURING METHOD THEREROF

CROSS-REFERENCE TO RELATED APPLICATIONS

This application claims priority under 35 U.S.C. § 119(a) from Korean Patent Application No. 2005-64803, filed on Jul. 18, 2005, the entire contents of which are incorporated herein by reference.

BACKGROUND OF THE INVENTION

1. Field of the Invention

The present invention relates in general to a film bulk acoustic wave resonator and manufacturing method thereof.

2. Description of the Related Art

For radio frequency (RF) band, a dielectric resonator, a metal cavity resonator and a piezoelectric thin film resonator (FBAR) are used.

These resonators are superior in terms of a small insertion loss, a frequency characteristic or temperature stability.

However, they are too big to be implemented as a compact and light integrated circuit on a semiconductor substrate.

When compared with the dielectric resonator or the metal cavity resonator, the FBAR can be manufactured to be compact and can be implemented on a silicon substrate or a gallium arsenic (GaAs) substrate, and can have a smaller insertion loss.

A filter, which uses the dielectric resonator, the metal cavity resonator and the FBAR, is one of the core components necessary for a mobile communication system.

Technology for the filter manufacture is indispensable to implement a compact, light and low power-consuming mobile terminal.

The dielectric filter and a Surface Acoustic Wave (SAW) filter are most widely used for RF for mobile communication.

The dielectric filter is used as a 900 MHz filter for a mobile phone for a home use, and a 1.8-1.9 GHz duplex filter for PCS. It features a high dielectric constant, a low insertion loss, stability in a temperature variation, a vibration resistance and a shock resistance.

However, it is difficult to implement a compact dielectric filter into a Monolithic Microwave Integrated Circuit (MMIC).

The SAW filter is smaller than the dielectric filter and can easily process a signal, and has advantages of a simple circuit and easy massproduction. In addition, the SAW filter does not need to be adjusted.

However, it is not easy to manufacture the SAW filter operating at more than a super high frequency (5 GHz or higher) band due to manufacturing process restrictions.

The FBAR filter is differentiated from the above filters in that it is very light and thin, and can be easily mass-produced by means of a semiconductor process and combined with RF active elements without any limitations.

The FBAR filter is a thin film where a cavity is created by a piezoelectric characteristic after a piezoelectric material, such as ZnO or AlN, is deposited on the silicon (Si) or GaAs substrate in a RF sputtering method.

An FBAR fabrication process comprises a membrane type, a Bragg reflector type and an air gap type.

In the Bragg reflector type FBAR fabrication method illustrated in FIG. 1, a reflection layer 11 formed by a material having a big acoustic impedance difference and deposited every other layer, a lower electrode 12, a piezoelectric layer 13 and an upper electrode 14 are formed on the substrate in order, where acoustic wave having passed the piezoelectric layer 13 is prevented from being transmitted further to the substrate direction and is totally reflected from the reflection layer 11, resulting in creation of an effective resonance.

The Bragg reflector type FBAR fabrication method is disadvantageous in that it is difficult to form a reflection layer structure having an accurate thickness of four or more reflection layers for total reflection and it takes long time and cost to manufacture, although there are advantages in that it is structurally rigid and no stress due to bending is generated.

Meanwhile, the air gap-type FBAR uses an air gap instead of the reflection layer to separate the substrate from the resonance part, and is divided into several types according to the manufacturing method used. Different types of air gap-type FBAR elements are illustrated in FIGS. 2A, 2B and 2C.

The FBAR element in FIG. 2A is a bulk micro-machining FBAR fabricated in such a manner that a membrane 21 is formed by $SiO_2$, for example, on a substrate 20, a cavity part 23 is defined by the anisotropic etching of a rear side of the substrate 20, and the acoustic resonator 22 is formed on the membrane 21. An FBAR element thus structured is not practical due to its very weak structure and a low recovery rate.

The FBAR element in FIG. 2B is a surface micro-machining FBAR fabricated as follows.

A sacrificial layer is formed on a substrate 30, and an insulation membrane 32 is formed on the sacrificial layer and the substrate 30. A first electrode 33, a piezoelectric layer 34 and a second electrode 35 are vapor-deposited in order, and finally, the sacrificial layer is removed to form an air gap 31.

More specifically, a via hole is formed to connect the exterior of the element to the sacrificial layer inside the element, and an etchant is injected through the via hole to remove the sacrificial layer. Consequently, the air gap 31 is formed.

Furthermore, in manufacturing the membrane, the sacrificial layer needs to be slanted, which causes a weak structure due to a high remaining stress of the membrane.

The FBAR element of FIG. 2C is fabricated in the following manner.

A cavity part 45 is defined by etching a substrate 40 using a photo-resist membrane, and a sacrificial layer is vapor-deposited on the cavity part 45.

A membrane 41, a first electrode 42, a piezoelectric layer 43, and a second electrode 44 are vapor-deposited in order on the sacrificial layer and the substrate 40. Then, an air gap 45 is formed by etching the sacrificial layer.

In the above manufacturing method, a wet etching and a dry etching are employed in forming the air gap 45.

In case of wet etching, it is hard to remove the etchant. Moreover, when the etchant is not completely removed, the element becomes weak due to continuous actions of the etchant, and the resonance frequency may be changed.

In case of dry etching, on the other hand, the etching is accomplished by a plasmatic gas. At this time, physical impact can be caused by an ion and a molecule, and the membrane 41 or the substrate 40 can be deteriorated by high temperature.

SUMMARY OF THE INVENTION

The present invention has been made to overcome the above-mentioned problems in the related art. Accordingly, it is a first aspect of the present invention to provide a film bulk acoustic resonator of a simple structure, reduced manufacturing processes and an improved degree of integration.

It is a second aspect of the present invention to provide a manufacturing method of a film bulk acoustic resonator.

In accordance with the first aspect of the present invention, there is provided a film bulk acoustic resonator comprising: a substrate; a lower electrode formed on top of the substrate; a piezoelectric membrane formed on top of the lower electrode and having a crystallographic axis so inclined as to generate a total reflection when an acoustic wave advances toward the lower electrode; and an upper electrode formed on top of the piezoelectric membrane.

The piezoelectric membrane may be formed with a dense medium while the lower electrode may be formed with a sparse medium.

The circumference of the piezoelectric membrane may further comprise an enveloping wall.

In accordance with the second aspect of the present invention, there is provided a manufacturing method of a film bulk acoustic resonator, the method comprising the steps of: forming a lower electrode on top of a substrate; forming a piezoelectric membrane on top of the lower electrode and having a crystallographic axis so inclined as to generate a total reflection when an acoustic wave advances toward the lower electrode; and forming an upper electrode on top of the piezoelectric membrane.

The method may further comprise a step of forming an enveloping wall encompassing the circumference of the piezoelectric membrane.

The enveloping wall may be vapor-deposited and patterned on the same layer as that of forming the upper electrode.

The piezoelectric membrane may be vapor-deposited using the sputtering or the evaporation method.

BRIEF DESCRIPTION OF THE DRAWING FIGURES

The above aspect and other features of the present invention will become more apparent by describing in detail exemplary embodiments thereof with reference to the attached drawing figures, wherein.

DETAILED DESCRIPTION OF THE EXEMPLARY EMBODIMENTS

Figure 1:
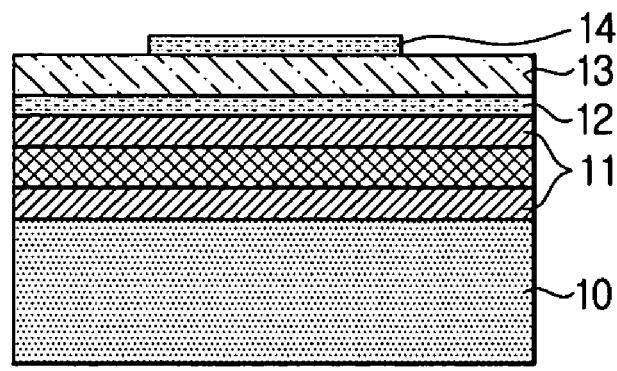
FIG. 1 is a cross-sectional view illustrating a structure of FBAR according to the prior art, and more specifically a cross-sectional view illustrating a structure of a Bragg reflector type FBAR.
Figure 2A:
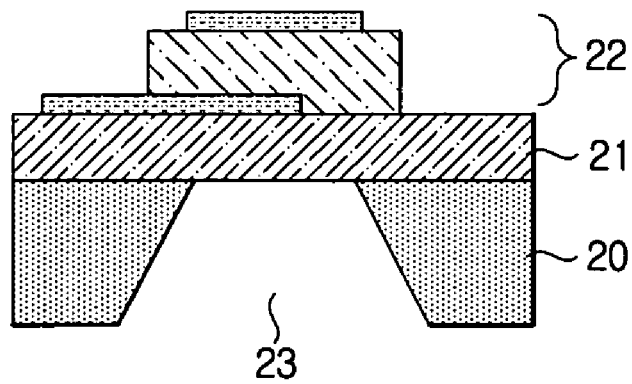
FIGS. 2A through 2C are cross-sectional views illustrating a structure of FBAR according to the prior art, and more specifically a structure of air gap type FBAR.
Figure 2B:
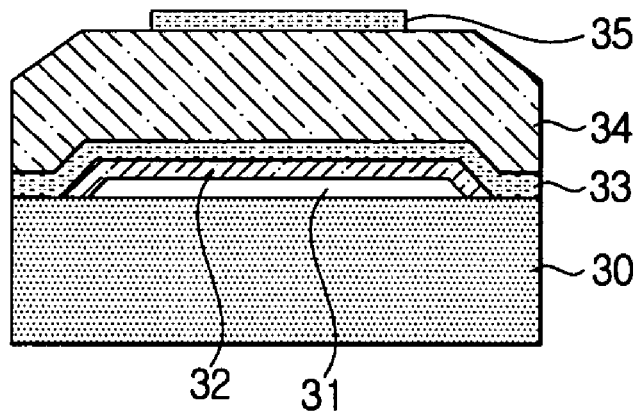
Figure 2C:
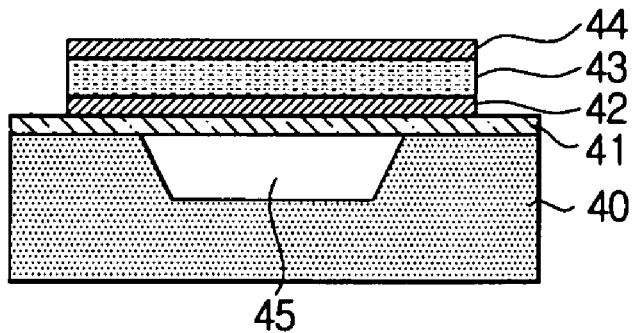

Hereinafter, exemplary embodiments of the present invention will be described in detail with reference to the accompanying drawings.

In the following description, same drawing reference numerals are used for the same elements even in different drawings. The matters defined in the description, such as a detailed construction and elements, are only provided to assist in a comprehensive understanding of the invention. Thus, it is apparent that the present invention can be carried out without those defined matters. Also, well-known functions or constructions are not described in detail since they would obscure the invention in unnecessary detail.

Figure 3:
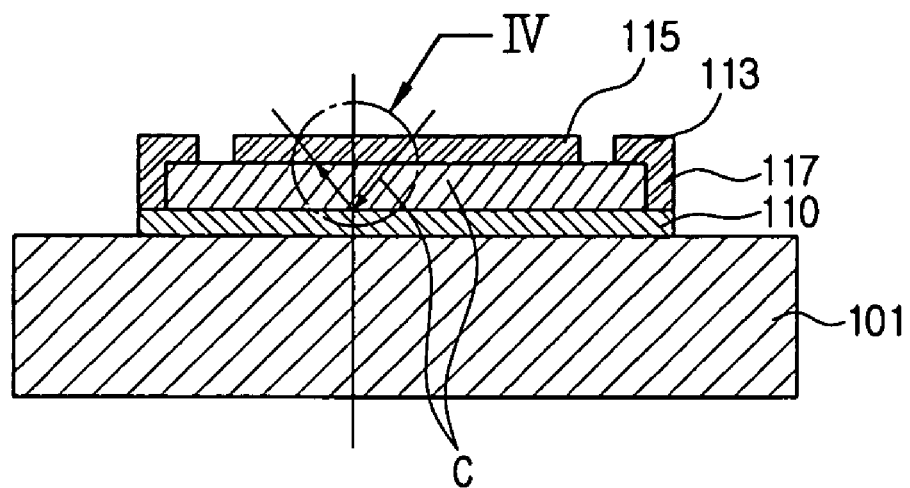
FIG. 3 is a cross-sectional view illustrating a structure of FBAR according to an embodiment of the present invention.
Figure 4:
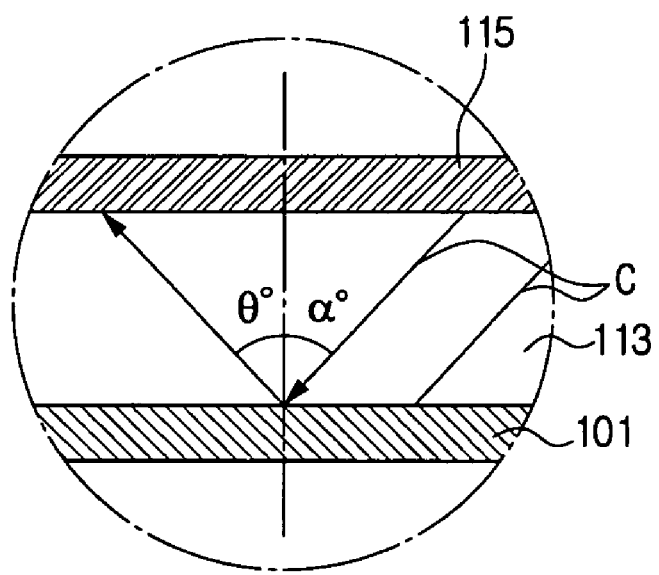
FIG. 4 is an enlarged view of display part IV of FIG. 3.

FIG. 3 is a cross-sectional view illustrating a structure of FBAR according to an embodiment of the present invention, and FIG. 4 is an enlarged view of display part IV of FIG. 3;

Referring to FIG. 3, a FBAR comprises a substrate 101, a lower electrode 110, a piezoelectric membrane 113 and an upper electrode 115.

The substrate 101 may be, for example, a silicon substrate.

The lower electrode 110 and the upper electrode 115, which serve to apply an electromagnetic field to the piezoelectric membrane 113, may use one of conductive materials, such as Al, W, Au, Pt, Ni, Ti, Cr, Pd, Ru or Mo.

The piezoelectric membrane 113 causes a piezoelectric effect when being applied with the electromagnetic field, and therefore generates an acoustic wave.

The piezoelectric membrane 113 according to the present invention is formed with a crystallographic axis (C) where a total reflection occurs from a boundary surface, i.e., from the top of the lower electrode 110 when an acoustic wave is incident on the lower electrode 110.

In general, for the piezoelectric membrane 113, AlN, Pb(ZrTi) $O_3$, ZnO or other material can be used.

For the total reflection of the acoustic wave, the above-mentioned materials are appropriately selected such that the piezoelectric membrane 113 is made of a dense material while the lower electric electrode 110 is made of a sparse material.

Referring to FIG. 4, the acoustic wave created by the piezoelectric effect of the piezoelectric membrane 113 is incident on the lower electrode 101 side at an incident angle ($\alpha°$) relative to the crystallographic axis (C), and totally reflected at the boundary surface with the lower electrode 110 and at an reflection angle ($\theta°$) relative to the crystallographic axis (C), which is the same as the incident angle ($\alpha°$).

Referring back to FIG. 3, the piezoelectric membrane 113 is circumferentially further formed with an enveloping wall 117.

The enveloping wall 117 functions to prevent the acoustic wave totally reflected from the top of the lower electrode 110 from being lost toward the lateral surface of the piezoelectric membrane 113, and may be so formed as to be connected to the lower electrode 110.

Now, manufacturing method of FBAR thus constructed will be described.

Figure 5A:
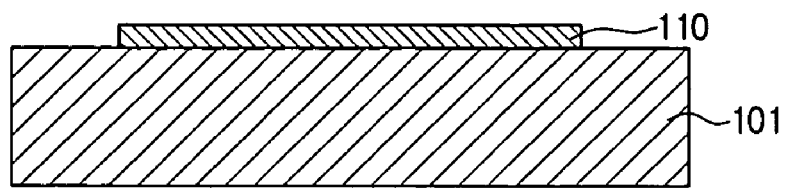
FIGS. 5A through 5C are cross-sectional views illustrating a FBAR manufacturing process according to another embodiment of the present invention.

Referring to FIG. 5A, a lower electrode 110 is formed on the top of the substrate 101, formed, for example, with silicon.

Figure 5B:
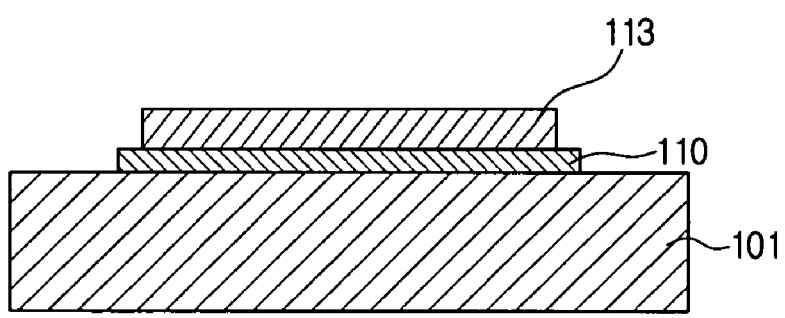

Referring to FIG. 5B, the piezoelectric membrane 113 is vapor-deposited and patterned on top of the lower electrode 110 to have a smaller region than that of the lower electrode 101.

At this time, the piezoelectric membrane 113 is so formed as to have a crystallographic axis (C) generating a total reflection when the acoustic wave caused by the piezoelectric effect is incident on the top of the lower electrode.

The piezoelectric membrane 113 may be vapor-deposited using the sputtering or the evaporation method.

Figure 5C:
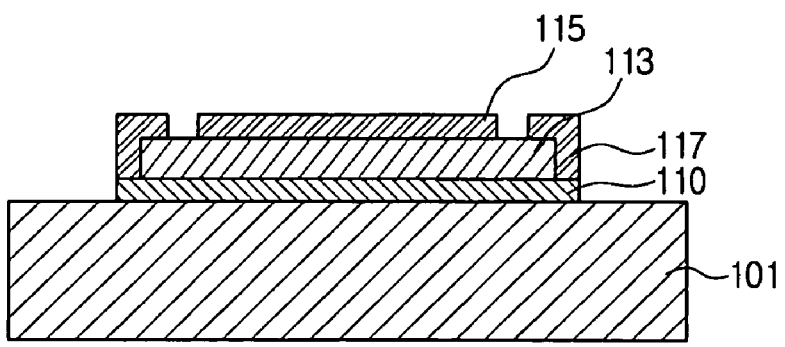

Referring to FIG. 5C, a conductive layer is vapor-deposited on top of the piezoelectric membrane 113 and patterned by the upper electrode 115.

The conductive layer is simultaneously vapor-deposited on the top of the lower electrode 110 protruding outside of the piezoelectric membrane 113 and on the lateral surface of the piezoelectric membrane 113 to form an enveloping wall 117.

As apparent from the foregoing, the FBAR thus constructed according to the embodiments of the present invention has a simple structure and the manufacturing process can be simplified. In addition, the resonant structure can be stably fabricated on top of a substrate.

While the invention has been shown and described with reference to certain embodiments thereof, it will be understood by those skilled in the art that various changes in form and details may be made therein without departing from the spirit and scope of the invention as defined by the appended claims.

What is claimed is:

1. A film bulk acoustic resonator comprising:
   a substrate;
   a lower electrode formed on top of the substrate;
   a piezoelectric membrane formed on top of the lower electrode and having a crystallographic axis so inclined as to generate a total reflection when an acoustic wave advances toward the lower electrode; and
   an upper electrode formed on top of the piezoelectric membrane.

2. The resonator as defined in claim 1, wherein the piezoelectric membrane is formed with a dense medium while the lower electrode is formed with a sparse medium.

3. The resonator as defined in claim 1, wherein the circumference of the piezoelectric membrane further comprises an enveloping wall.

4. The resonator as defined in claim 3, wherein the enveloping wall prevents the acoustic wave from being lost toward the lateral surfaces of the piezoelectric membrane.

5. The resonator as defined in claim 3, wherein the enveloping wall connects to the lower electrode.

6. The resonator as defined in claim 3, wherein the piezoelectric member has a smaller region that the lower electrode.

7. The resonator as defined in claim 6, wherein the enveloping wall is on top of the lower electrode protruding outside of the piezoelectric membrane and on the lateral surfaces of the piezoelectric membrane.

* * * * *